(12) United States Patent
Yoon

(10) Patent No.: US 10,964,856 B1
(45) Date of Patent: Mar. 30, 2021

(54) METHOD OF PREPARING WHITE LIGHT-EMITTING MATERIAL

(71) Applicant: KNU-INDUSTRY COOPERATION FOUNDATION, Chuncheon-si (KR)

(72) Inventor: Jong Hwan Yoon, Chuncheon-si (KR)

(73) Assignee: KNU-INDUSTRY COOPERATION FOUNDATION, Chuncheon-si (KR)

( * ) Notice: Subject to any disclaimer, the term of this patent is extended or adjusted under 35 U.S.C. 154(b) by 0 days.

(21) Appl. No.: 16/737,485

(22) Filed: Jan. 8, 2020

(30) Foreign Application Priority Data

Sep. 27, 2019 (KR) .......................... 10-2019-0119550

(51) Int. Cl.
| H01L 33/02 | (2010.01) |
| H01L 33/50 | (2010.01) |
| C23C 16/50 | (2006.01) |
| C23C 16/40 | (2006.01) |
| C23C 14/14 | (2006.01) |
| C23C 14/24 | (2006.01) |

(52) U.S. Cl.
CPC ............ *H01L 33/504* (2013.01); *C23C 14/14* (2013.01); *C23C 14/24* (2013.01); *C23C 16/401* (2013.01); *C23C 16/50* (2013.01); *H01L 2933/0041* (2013.01)

(58) Field of Classification Search
CPC ..................................................... H01L 33/02
See application file for complete search history.

(56) References Cited

FOREIGN PATENT DOCUMENTS

| KR | 10-1317406 B1 | 10/2013 |
| WO | WO 98/05078 A1 | 2/1998 |

OTHER PUBLICATIONS

Jong-Hwan Yoon, Wide-Range Light Emission of Silicon Oxide Nanowires Grown Using Zinc as a Catalyst, New Physics: Sae Mulli, vol. 69, No. 5, May 2019, pp. 468-472.
Korean Office Action dated Nov. 16, 2020, issued to Korean Application No. 10-2019-0119550.
Jong-Hwan Yoon, "Generation of White Light by Hybridization of Red-Green-Blue-Luminescent Materials", Physica Status Solidi A, 2019, 1900411 pp. 1-4.

*Primary Examiner* — Austin Murata
(74) *Attorney, Agent, or Firm* — Stein IP, LLC

(57) ABSTRACT

Disclosed herein is a method of preparing a white light-emitting material. The method of preparing a white light-emitting material includes the steps of: (a) depositing a metal for the formation of a blue light-emitting material on a substrate by performing thermal evaporation; (b) forming a material in which green and blue light-emitting materials are hybridized by placing the substrate, on which the metal film is deposited in step (a), in a plasma-enhanced chemical vapor deposition (PECVD) reactor and exposing the substrate to silicon (Si) and oxygen (O) in a plasma state; and (c) forming a red light-emitting material in the material formed in step (b) by annealing the material formed in step (b) so that the red, green and blue light-emitting materials are hybridized.

11 Claims, 5 Drawing Sheets

METHOD OF PREPARING WHITE LIGHT-EMITTING MATERIAL

CROSS-REFERENCE TO RELATED APPLICATION

This application claims the benefit of Korean Patent Application No. 10-2019-0119550 filed on Sep. 27, 2019, which is hereby incorporated by reference herein in its entirety.

BACKGROUND

1. Technical Field

The present invention relates to a method of preparing a white light-emitting material that is used for the implementation of a white light-emitting diode (LED) and has applicability to various fields.

2. Description of the Related Art

White light-emitting diodes (LEDs) have various advantages such as low power consumption, long life, small size, rapid response, long durability, and the easy control of light output using current, and are thus used in various fields. In particular, white LED light sources attract a lot of attention because they have high applicability to various photoelectric devices such as displays, biosensors, etc., as well as lighting.

Currently, among methods of manufacturing a white LED, the most widely researched method is a method of implementing white by combining a blue LED light source with a yellow light-emitting phosphor. This method was disclosed in International Publication No. WO98/005078 (entitled "Light Emitting Device and Display Device," filed on Jul. 29, 1997, and published on Feb. 5, 1998), and in the book "The Blue Laser Diode" (S. Nakamura, Springer-Verlag, 1997) of Shuji Nakamura of Japan, etc.

The white light-emitting material prepared by the above-described method is problematic in that it has a low color rendering index, even though it has excellent white light-emitting efficiency and in that the color rendering index changes according to current density and the time for which it has been used. In particular, the intensity of blue light, which is an excitation light source emitted from the LED, is strong and the intensity of green and red light emitted from the phosphor is weak, and thus blue cool white light such as the light of a fluorescent lamp and moonlight is produced, thereby limiting its utility.

SUMMARY

The present invention has been conceived to overcome the above-described problems, and an object of the present invention is to provide a method of preparing a white light-emitting material that can be applied to various fields because it has an excellent color rendering index.

In order to accomplish the above object, one aspect of the present invention provides a method of preparing a white light-emitting material, the method including the steps of: (a) depositing a metal for the formation of a blue light-emitting material on a substrate by performing thermal evaporation; (b) forming a material in which green and blue light-emitting materials are hybridized by placing the substrate, on which the metal film is deposited in step (a), in a plasma-enhanced chemical vapor deposition (PECVD) reactor and exposing the substrate to silicon (Si) and oxygen (O) in a plasma state; and (c) forming a red light-emitting material in the material formed in step (b) by annealing the material formed in step (b) so that the red, green and blue light-emitting materials are hybridized.

In step (a); the metal may be zinc (Zn).

The blue light-emitting material formed in step (b) may be zinc oxide (ZnO), and the green light-emitting material may be silicon oxide including $SiO_x$ ($0<x<2$).

The material, in which the green and blue light-emitting materials are hybridized, formed in step (b) may be silicon-rich oxide nanowires (SONWs) including zinc oxide (ZnO) phases.

The red light-emitting material formed in step (c) may be silicon nanocrystals (Si nanocrystals).

Step (b) may include supplying mixed gas, including 5% silane ($SiH_4$) and nitrous oxide ($N_2O$) diluted with nitrogen, into the PECVD reactor, and a white light spectrum may be tuned according to the mixing ratio ($R=N_2O/SiH_4$) of the mixed gas.

The white light spectrum may be tuned according to the thickness of the metal film that is deposited on the substrate.

Another aspect of the present invention provides a white light-emitting material that is prepared by the method of preparing a white light-emitting material.

The white light-emitting material may have a light-emitting wavelength in the range of 350 nm to 900 nm.

Still another aspect of the present invention provides a photoelectric device that is manufactured by using the white light-emitting material.

BRIEF DESCRIPTION OF THE DRAWINGS

The above and other objects, features, and advantages of the present invention will be more clearly understood from the following detailed description taken in conjunction with the accompanying drawings, in which:

FIGS. 2A-2D show the shape and physical characteristics of a sample prepared through step (b) in the method of preparing a white light-emitting material according to the embodiment of the present invention, wherein FIG. 2A is a surface scanning electron microscopy (SEM) photograph of the sample, FIG. 2B is the energy-dispersive X-ray (EXD) spectrum of a point indicated by the arrow in the nanowires shown in FIG. 2A, and FIGS. 2C and 2D show an X-ray diffraction (XRD) pattern and a photoluminescence (PL) spectrum, respectively;

FIG. 4A-4B is shown to illustrate the possibility of tuning the light-emitting spectrum of the white light-emitting material prepared by the method of preparing a white light-emitting material according to the embodiment of the present invention, wherein FIG. 4A shows PL spectra according to the mixing ratio of mixed gas supplied into a PECVD reactor, and FIG. 4B shows PL spectra according to the thickness of a zinc (Zn) film deposited on a substrate.

DETAILED DESCRIPTION

Embodiments of the above-described present invention will be described in detail with reference to the accompanying drawings. For brevity of description, descriptions of well-known technical parts will be omitted or abridged.

Figure 1:
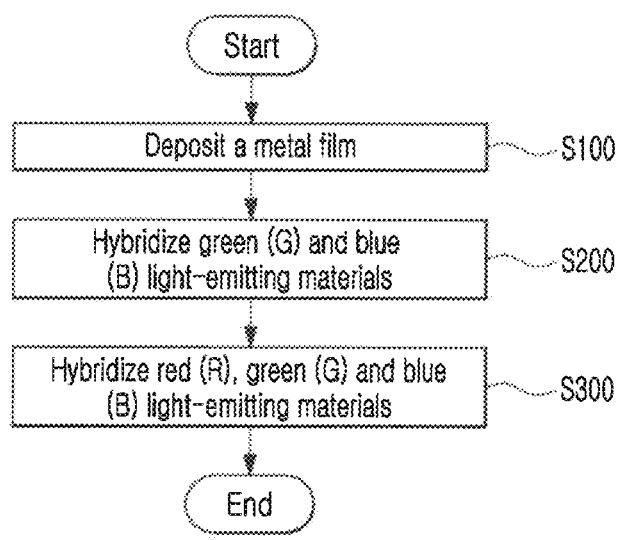
FIG. 1 is a flowchart showing a method of preparing a white light-emitting material according to an embodiment of the present invention.
Figure 2A:
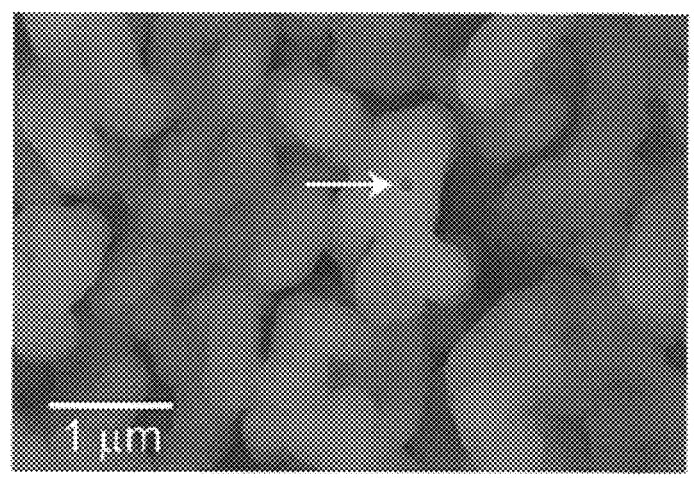
Figure 2B:
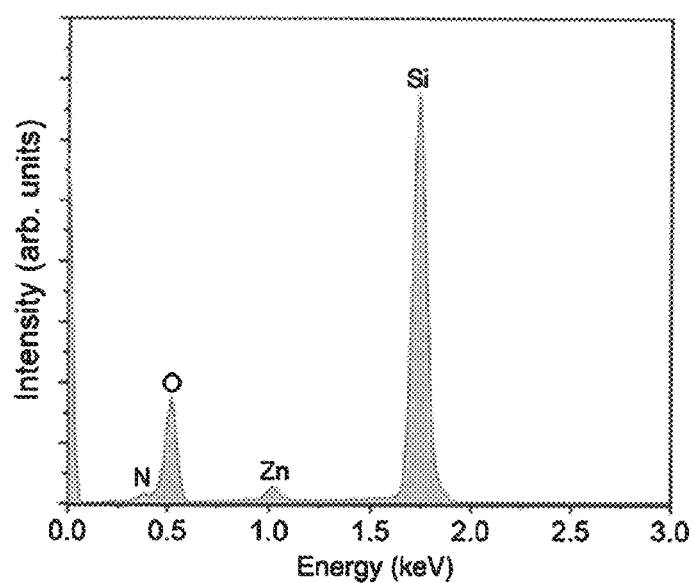
Figure 2C:
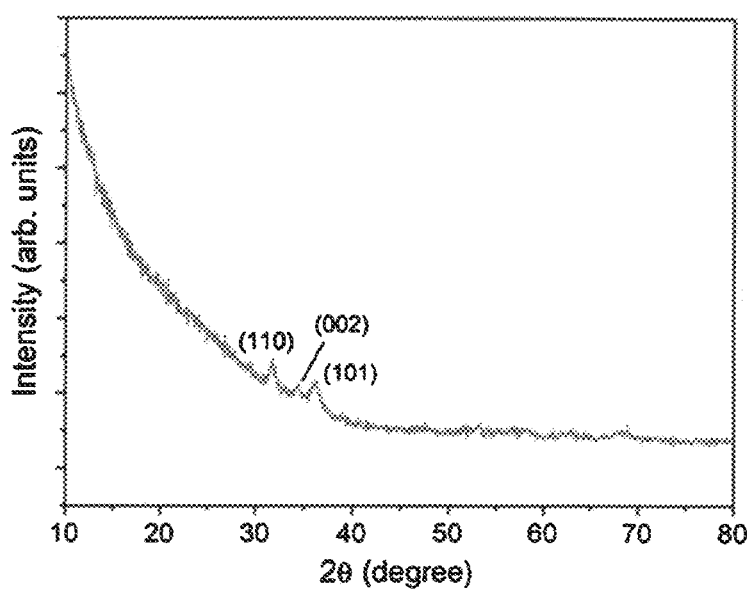
Figure 2D:
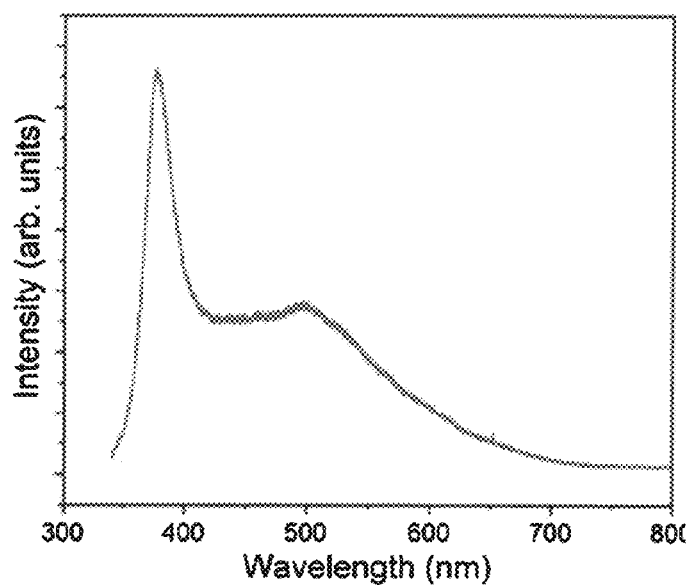
Figure 3A:
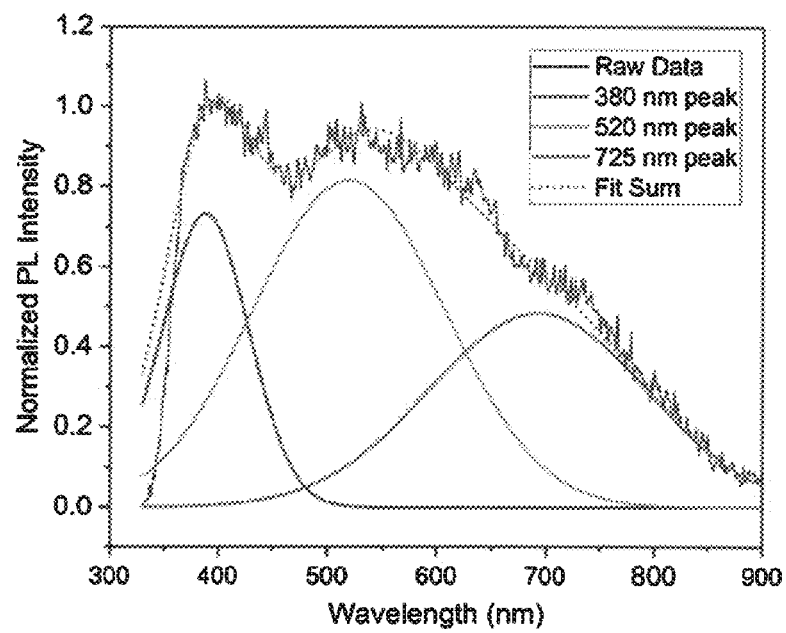
FIG. 3A shows the PL spectrum of the white light-emitting material prepared by the method of preparing a white light-emitting material according to the embodiment of the present invention and the PL spectra of blue (B), green (G) and red (R)

FIG. 1 is a flowchart showing a method of preparing a white light-emitting material according to an embodiment of the present invention, and FIGS. 2A-2D show the shape and physical characteristics of a sample prepared through step (b) in the method of preparing a white light-emitting material according to the embodiment of the present invention. In this case, FIG. 2A is a surface scanning electron microscopy (SEM) photograph of the sample, FIG. 2B is the energy-dispersive X-ray (EXD) spectrum of a point indicated by the arrow in the nanowires shown in FIG. 2A, and FIGS. 2C and 2D show an X-ray diffraction (XRD) pattern and a photoluminescence (PL) spectrum, respectively. Furthermore, FIG. 3A shows the PL spectrum of the white light-emitting material prepared by the method of preparing a white light-emitting material according to the embodiment of the present invention and the PL spectra of blue (B), green (G) and red (R), and FIG. 36 shows blue, green, red and white emitted from the prepared white light-emitting material.

Referring to FIGS. 1 to 3B, a method of preparing a white light-emitting material according to an embodiment of the present invention includes: step (a) of depositing a metal film; step (b) of hybridizing green (G) and blue (B) light-emitting materials; and step (c) of hybridizing red (R), green (G), and blue (B) light-emitting materials.

1. Step (a) S100

Step (a) S100 is the step of depositing a metal for the formation of a blue light-emitting material on a substrate by performing thermal evaporation. In this case, the metal according to the embodiment of the present invention may be zinc (Zn). Furthermore, although a p-type silicon substrate is used as the substrate, the substrate is not limited thereto.

In this case, the metal atoms of the metal film react with oxygen (O) in a plasma state in step (b) S200 to be described later, thereby forming zinc oxide (ZnO), which is a blue light-emitting material. Furthermore, the metal atoms of the metal film may act as a metal catalyst to form nanowires (NWs) in step (b) S200.

For reference, the white light spectrum of the white light-emitting material prepared by the method of preparing a white light-emitting material according to the embodiment of the present invention may be tuned according to the thickness of the metal film deposited on the substrate in step (a) S100. This will be described in detail later.

2. Step (b) S200

Step (b) S200 is the step of placing the substrate, on which the metal film is deposited in step (a) S100, in a plasma-enhanced chemical vapor deposition (PECVD) reactor, and exposing the substrate to silicon (Si) and oxygen (O) in a plasma state, thereby forming a material in which the green and blue light-emitting materials are hybridized.

In this case, the blue light-emitting material formed in step (b) S200 is zinc oxide (ZnO), and the green light-emitting material is silicon oxide including $SiO_x$ (0<x<2). Furthermore, the material, in which the green and blue light-emitting materials are hybridized, formed in step (b) S200 is silicon-rich oxide nanowires (SONWs) including zinc oxide (ZnO) phases.

In greater detail, plasma-enhanced chemical vapor deposition (PECVD) is performed in step (b) S200, in which the substrate coated with the metal film is placed in the PECVD reactor, and mixed gas is supplied into the PECVD reactor. In this case, the mixed gas is ionized by electrodes generating PECVD plasma inside the reactor, and the ionized silicon (Si) and oxygen (O) in a plasma state reach the substrate on which the metal film is deposited and form a material in which the green and blue light-emitting materials are hybridized, i.e., SONWs.

In this case, in the method of preparing a white light-emitting material according to the embodiment of the present invention, the substrate on which the metal film is deposited is placed on the grounded electrodes, and is exposed to silicon (Si) and oxygen (O) in a plasma state for 10 minutes in the state in which a predetermined temperature of 380° C. is maintained, thereby forming SONWs.

In this case, in order to generate silicon (Si) and oxygen (O) in a plasma state, mixed gas including 5% silane ($SiH_4$) and nitrous oxide ($N_2O$) diluted with nitrogen is supplied into the PECVD reactor, and the mixing ratio R of the mixed gas is defined as $N_2O/SiH_4$.

For reference, the white light spectrum of the white light-emitting material prepared by the method of preparing a white light-emitting material according to the embodiment of the present invention may be tuned according to the mixing ratio of the mixed gas ($R=N_2O/SiH_4$). This will be described in detail later.

FIG. 2A is a surface SEM photograph of a sample grown by exposing a substrate coated with a zinc (Zn) film having a thickness of 300 nm to silicon (Si) and oxygen (O) in a plasma state at 380° C. for 10 minutes. In this case, mixed gas having R=0.7 was supplied into a PECVD reactor. The presence of NWs is clearly observed in the photograph of FIG. 2A. In this case, the NWs may be formed as the metal atoms of the metal film, i.e., zinc (Zn), act as a metal catalyst.

FIG. 2B shows the chemical composition of the NWs. The EXD spectrum shown in FIG. 2B is obtained by measuring a point indicated by the white arrow shown in FIG. 2A. In this case, in the spectrum of FIG. 2B, three peaks corresponding to the elements Si ($\approx$38.0 at %), O ($\approx$53.8 at %) and Zn ($\approx$2.4 at %), respectively, are present. This indicates that the NWs are SONWs based on $SiO_{1.4}$ phases including Zn atoms.

Furthermore, FIG. 2C shows the XRD pattern of the NWs. The small peaks shown in FIG. 2C coincide with the peaks of ZnO crystals having a hexagonal shape. From this, it can be seen that ZnO phases are present in the SONWs. For reference, the lattice planes shown in FIG. 20 correspond to the peaks of ZnO crystals included in the International Centre for Diffraction Data (ICDD) (ICDD card No. 01-075-0576).

FIG. 2D shows the PL spectrum of an SONWs sample measured at room temperature ($\approx$25° C.). In this case, in FIG. 2D, two peaks are observed at approximately 380 nm and 530 nm.

In this case, the peak close to 380 nm was originated from ZnO crystals. In other words, it can be seen that the SNOWs include ZnO phases. In contrast, 530 nm was attributable to the presence of nonbridging oxygen hole centers (NHOHCs), which might usually be caused by at least any one of $SiO_x$ (0<x<2) phases and a ZnO-related detect.

From the results shown in FIGS. 2A-2D, it can be seen that the SONWs formed in step (b) of the method of preparing a white light-emitting material according to the embodiment of the present invention include a light-emitting material in which two colors (blue and green) are hybridized.

3. Step (c) S300

Step (c) S300 is the step of forming a red light-emitting material in the material formed in step (b) by annealing the latter material so that red, green and blue light-emitting materials are hybridized. In this case, the red light-emitting material formed in step (c) is silicon nanocrystals (Si NCs).

In other words, in step (c) S300, Si NCs, which are a red light-emitting material, are formed in the SONWs obtained in step (b) S200 by annealing the SONWs, thereby preparing a white light-emitting material in which red (R), green (G) and blue (B) light-emitting nanomaterials are synthesized. In this case, the prepared white light-emitting material has a light-emitting wavelength in the range of 350 nm to 900 nm.

For reference, Si NCs may be easily grown by annealing $SiO_x$ at a high temperature of 1100° C. Accordingly, the red light-emitting material may be hybridized with the SONWs including SiO 1.4 by an annealing process. For reference, Si NCs strongly emit light in the red/near-infrared (NIR) spectral region at room temperature.

In this case, the annealing process according to the method of manufacturing a white light-emitting material according to the embodiment of the present invention was performed by placing a substrate on which SONWs were formed in a quartz tube reactor and also heat-treating the substrate in an atmosphere of high purity $N_2$ gas (99.999%).

FIG. 3A shows the PL spectrum (raw data) of SONWs annealed for one hour at 1,100° C. In this case, FIG. 3A indicates that the PL intensity in the red/NIR spectral region was improved when compared with that of the PL spectrum shown in FIG. 2D, so that white light having a broad PL spectrum ranging from 350 nm to 850 nm was formed.

Furthermore, FIG. 3A shows a PL spectrum divided into three sub-spectra using a Gaussian function in order to distinguish PL bands corresponding to blue, green, and red colors. The peaks of the three sub-bands are estimated at 390 nm, 520 nm, and 700 nm, respectively, which correspond to the PL bands derived from ZnO, $SiO_x$ and Si NCs phases.

Figure 3B:
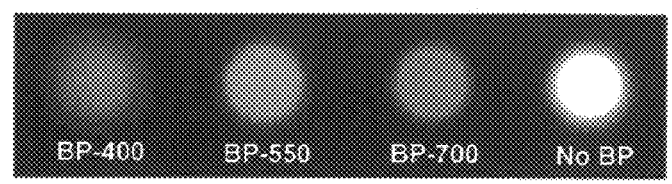
FIG. 3B shows blue, green, red and white emitted from the prepared white light-emitting material.

Furthermore, these PL bands are consistent with images acquired using narrow bandpass (BP) fitters having center wavelengths of 400 nm, 550 nm and 700 nm shown in FIG. 3B.

Accordingly, as shown in FIG. 3B, it can be seen that the white light-emitting material prepared by the method of preparing a white light-emitting material according to the embodiment of the present invention was formed in such a manner that three colors, i.e., red (R), green (G), and blue (B), were successfully hybridized.

Figure 4A:
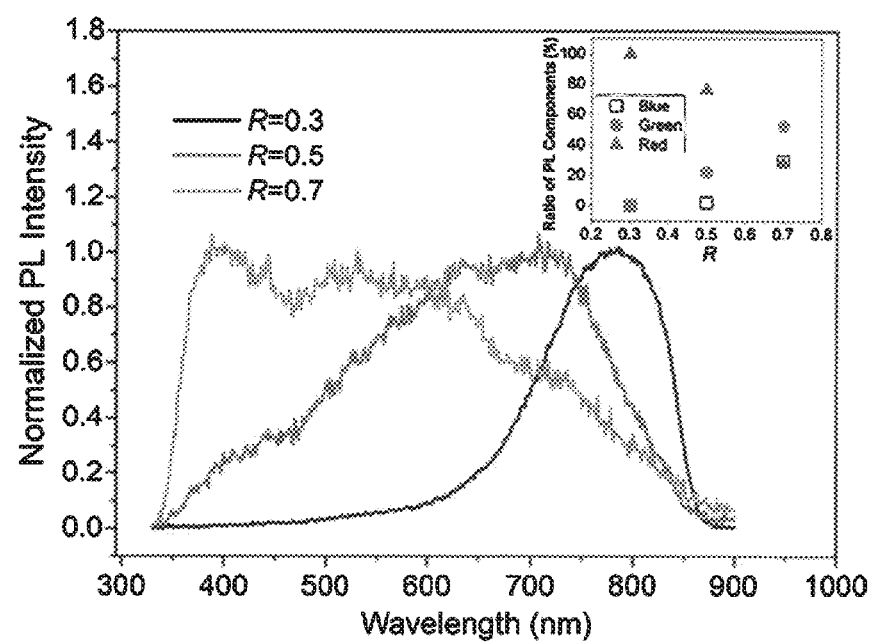
Figure 4B:
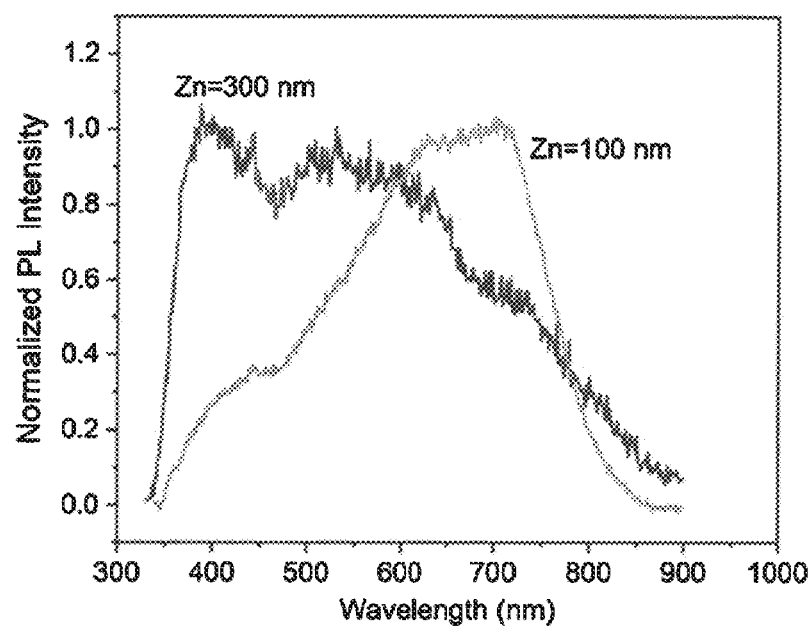

Meanwhile, FIGS. 4A-4B are shown to illustrate the possibility of tuning the light-emitting spectrum of the white light-emitting material prepared by the method of preparing a white light-emitting material according to the embodiment of the present invention. FIG. 4A shows PL spectra according to the mixing ratio of mixed gas supplied into a PECVD reactor, and FIG. 4B shows PL spectra according to the thickness of a zinc (Zn) film deposited on a substrate.

For reference, PL intensity was normalized to the maximum value of each spectrum.

Referring to FIG. 4A-4B, the white light spectrum may be adjusted within the range of 350 nm to 850 nm according to the mixing ratio R of the mixed gas and the thickness of the metal film deposited on the substrate.

First, FIG. 4A shows the PL spectra of samples obtained by placing substrates, each coated with a zinc (Zn) film having a thickness of 300 nm, in a PECVD reactor, exposing the substrates to different types of plasma formed at the different mixing ratios ($R=N_2O/SiH_4$) of mixed gases, and annealing obtained SNOWs at 1100° C. for one hour.

From FIG. 4A, it can be seen that when the ratio R is high, the PL intensity is high in a wavelength band close to the UV spectral region. Furthermore, the data inserted into FIG. 4A indicates that as R increases, red-related PL components decrease but green and blue PL components increase.

This result indicates that the white light spectrum can be adjusted according to the R value.

Next, FIG. 4B shows the PL spectra of samples obtained by placing substrates, coated with zinc (Zn) films having thicknesses of 100 nm and 300 nm, respectively, in a PECVD reactor, exposing the substrates to plasma formed at R=0.7, and annealing obtained SNOWs at 1100° C. for one hour.

In FIG. 4B, it can be seen that when the thickness of the zinc (Zn) film is large, the PL intensity is high in the wavelength band close to the UV spectral region. This can be understood as a result of the increased formation of ZnO phases, which indicates that the white light spectrum can be adjusted according to the thickness of the metal (Zn) film deposited on the substrate.

For reference, the PL measurement performed to analyze the light emission characteristics of light in the present invention was made at room temperature (≈25° C.).

The white light-emitting material can be prepared by the above-described method of preparing a white light-emitting material. In this case, the prepared white light-emitting material has a light emission wavelength in the range of 350 nm to 900 nm.

Moreover, a photoelectric device may be manufactured using the white light-emitting material prepared by the above-described method of preparing a white light-emitting material.

As described above, according to the present invention, the following effects are achieved:

First, unlike the conventional technology providing a low color rendering index because it has only a partial spectrum in the visible light spectral region as white is implemented by combining a blue LED light source with a yellow light-emitting phosphor, the present invention prepares a white light-emitting material having a light-emitting wavelength in the range of 350 nm to 900 nm by hybridizing red, green and blue light-emitting nanomaterials. Accordingly, the prepared white light-emitting material may have an excellent color rendering index.

Second, in the preparation of the white light-emitting material, a white light spectrum may be tuned within the range of 350 nm to 900 nm by adjusting the mixing ratio of mixed gas introduced into a PECVD reactor and the thickness of a metal film deposited on a substrate. Accordingly, the white light-emitting material prepared by the preparation method proposed by the present invention may be applied to various fields.

Although the present invention has been specifically described using the embodiments taken with reference to the accompanying drawings, as described above, the above-described embodiments are described merely using preferred examples of the present invention. Accordingly, the present invention should not be interpreted as being limited only to the above-described embodiments, and the scope of the present invention should be interpreted as encompassing the following claims and ranges equivalent to the claims.

What is claimed is:

1. A method of preparing a white light-emitting material, the method comprising the steps of:
   (a) depositing a metal film for formation of a blue light-emitting material on a substrate by performing thermal evaporation;
   (b) forming a material in which green and blue light-emitting materials are hybridized by placing the substrate, on which the metal film is deposited in step (a), in a plasma-enhanced chemical vapor deposition (PECVD) reactor and exposing the substrate to silicon (Si) and oxygen (O) in a plasma state; and (c) forming a red light-emitting material in the material formed in step (b) by annealing the material formed in step (b) so that the red, green and blue light-emitting materials are hybridized.

2. The method of claim 1, wherein in step (a), the metal is zinc (Zn).

3. The method of claim 2, wherein the blue light-emitting material formed in step (b) is zinc oxide (ZnO), and the green light-emitting material is silicon oxide including $SiO_x$, wherein $0<x<2$.

4. The method of claim 3, wherein the material, in which the green and blue light-emitting materials are hybridized, formed in step (b) is silicon-rich oxide nanowires (SONWs) including zinc oxide (ZnO) phases.

5. The method of claim 4, wherein the red light-emitting material formed in step (c) is silicon nanocrystals (Si nanocrystals).

6. The method of claim 5, wherein:
step (b) comprises supplying mixed gas, including 5% silane ($SiH_4$) and nitrous oxide ($N_2O$) diluted with nitrogen, into the PECVD reactor; and
a white light spectrum is tuned according to a mixing ratio ($R=N_2O/SiH_4$) of the mixed gas.

7. The method of claim 5, wherein the white light spectrum is tuned according to a thickness of the metal film that is deposited on the substrate.

8. A white light-emitting material that is prepared by the method of preparing a white light-emitting material set forth in claim 1.

9. The white light-emitting material of claim 8, wherein the white light-emitting material has a light-emitting wavelength in a range of 350 nm to 900 nm.

10. A photoelectric device that is manufactured by using the white light-emitting material set forth in claim 8.

11. A photoelectric device that is manufactured by using the white light-emitting material set forth in claim 9.

* * * * *